(12) United States Patent
Woodings et al.

(10) Patent No.: US 8,160,839 B1
(45) Date of Patent: Apr. 17, 2012

(54) SYSTEM AND METHOD FOR DEVICE RECOGNITION BASED ON SIGNAL PATTERNS

(75) Inventors: Ryan Woodings, Boise, ID (US); Brian Tuttle, Meridian, ID (US)

(73) Assignee: MetaGeek, LLC, Boise, ID (US)

( * ) Notice: Subject to any disclaimer, the term of this patent is extended or adjusted under 35 U.S.C. 154(b) by 793 days.

(21) Appl. No.: 12/288,038

(22) Filed: Oct. 16, 2008

Related U.S. Application Data

(60) Provisional application No. 60/999,247, filed on Oct. 16, 2007.

(51) Int. Cl.
*G06F 3/48* (2006.01)

(52) U.S. Cl. .......... 702/189; 702/76; 702/122; 702/181; 714/738; 455/456.1

(58) Field of Classification Search .................. 702/189, 702/181, 122, 76; 370/477, 205, 208, 330; 714/738, 740, 744; 455/456.1
See application file for complete search history.

(56) References Cited

U.S. PATENT DOCUMENTS

2004/0198386 A1 * 10/2004 Dupray ..................... 455/456.1
* cited by examiner

*Primary Examiner* — Drew A Dunn
*Assistant Examiner* — Hien Vo
(74) *Attorney, Agent, or Firm* — Merchant & Gould P.C.

(57) ABSTRACT

A computationally implemented method for recognizing devices based on detected signal patterns includes generating a plurality of signal pattern templates for a plurality of radio frequency communication signals, determining a matching signal pattern template for the detected signal pattern, and overlaying the matching signal pattern over the detected signal pattern.

18 Claims, 11 Drawing Sheets

SYSTEM 100

800

802
generating a plurality of signal pattern templates for a plurality of radio frequency communication signals

804
determining a matching signal pattern template for the detected signal pattern

806
overlaying the matching signal pattern over the detected signal pattern

802
generating a plurality of signal pattern templates for a plurality of radio frequency communication signals > 902 generating at least one signal pattern template outlining a detectable signal viewable on a user interface in a frequency versus amplitude view > 904 generating at least one signal pattern template outlining a detectable signal viewable on a user interface in a frequency versus time view

804
determining a matching signal pattern template for the detected signal pattern

806
overlaying the matching signal pattern over the detected signal pattern

802
generating a plurality of signal pattern templates for a plurality of radio frequency communication signals

1002 storing metadata for a detected signal pattern

1004 storing at least one of an allowed central frequency, an average frequency range, a geographic location, a geographic region, device identifying information, or a date stamp

804
determining a matching signal pattern template for the detected signal pattern

806
overlaying the matching signal pattern over the detected signal pattern

802
generating a plurality of signal pattern templates for a plurality of radio frequency communication signals

804
determining a matching signal pattern template for the detected signal pattern 1102 calculating a plurality of points forming the detected signal pattern 1104 converting a color image of the detected signal pattern into a grayscale image 1106 utilizing an edge detection algorithm 1108 detecting an input grayscale image and generating an output image displaying a plurality of tracked intensity discontinuity locations 1110 comparing a detected signal pattern to the plurality of generated signal pattern templates

806
overlaying the matching signal pattern over the detected signal pattern

SYSTEM AND METHOD FOR DEVICE RECOGNITION BASED ON SIGNAL PATTERNS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications; claims benefits under 35 USC §119(e) for provisional patent applications), and incorporates by reference in its entirety all subject matter of the following listed application(s) to the extent such subject matter is not inconsistent herewith:

RELATED APPLICATIONS

1. The present application claims the benefit under 35 U.S.C. §119 of and incorporates by reference U.S. Provisional Application Ser. No. 60/999,247, filed Oct. 16, 2007.

FIELD

The present invention relates generally to the field of spectrum analyzers and more particularly to a spectrum analyzer interface.

BACKGROUND

Conventional spectrum analyzers lack certain spectrum display and data manipulation features, creating additional work for a user desiring a particular spectrum display or spectrum data manipulation. Consequently, it would be desirable to provide a system and method for enhanced graphical display and data manipulation for spectrum analysis.

SUMMARY

A computationally implemented system includes, but is not limited to: a signal pattern template generating module generating a plurality of signal pattern templates for a plurality of radio frequency communication signals; a signal pattern matching determiner module determining a matching signal pattern template for a detected signal pattern; and a signal pattern template overlay module overlaying the matching signal pattern over the detected signal pattern. In addition to the foregoing, other system aspects are described in the claims, drawings, and text forming a part of the present disclosure.

A computationally implemented method includes, but is not limited to: generating a plurality of signal pattern templates for a plurality of radio frequency communication signals; determining a matching signal pattern template for a detected signal pattern; and overlaying the matching signal pattern over the detected signal pattern. In addition to the foregoing, other computationally implemented method aspects are described in the claims, drawings, and text forming a part of the present disclosure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 8 illustrates an operational flow representing example operations related to providing signal pattern matching.

FIG. 9 illustrates an alternative embodiment of the operational flow of FIG. 8.

FIG. 10 illustrates an alternative embodiment of the operational flow of FIG. 8.

FIG. 11 illustrates an alternative embodiment of the operational flow of FIG. 8.

DETAILED DESCRIPTION

Figure 1:
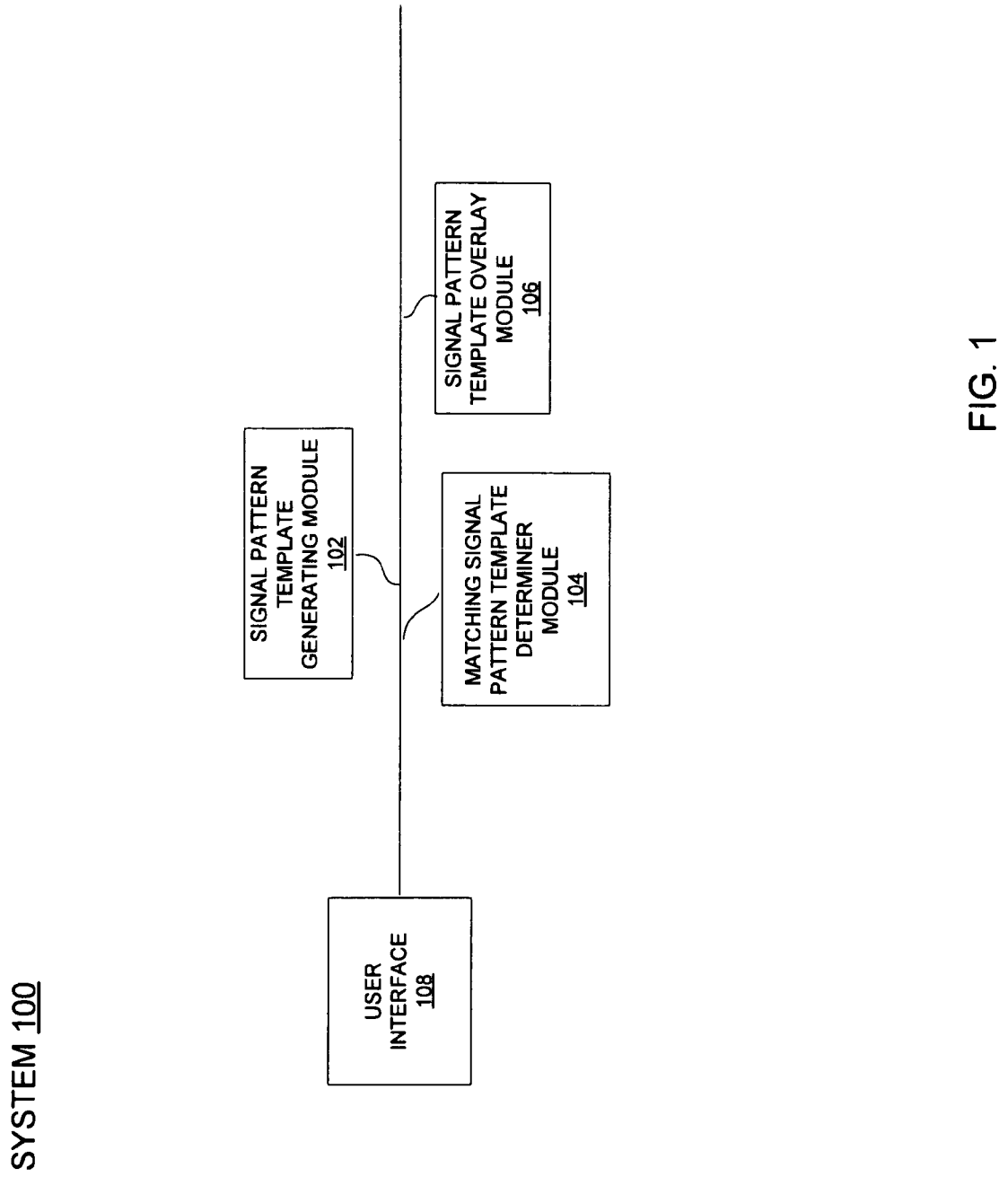
FIG. 1 illustrates an exemplary environment in which one or more technologies may be implemented.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Figure 2:
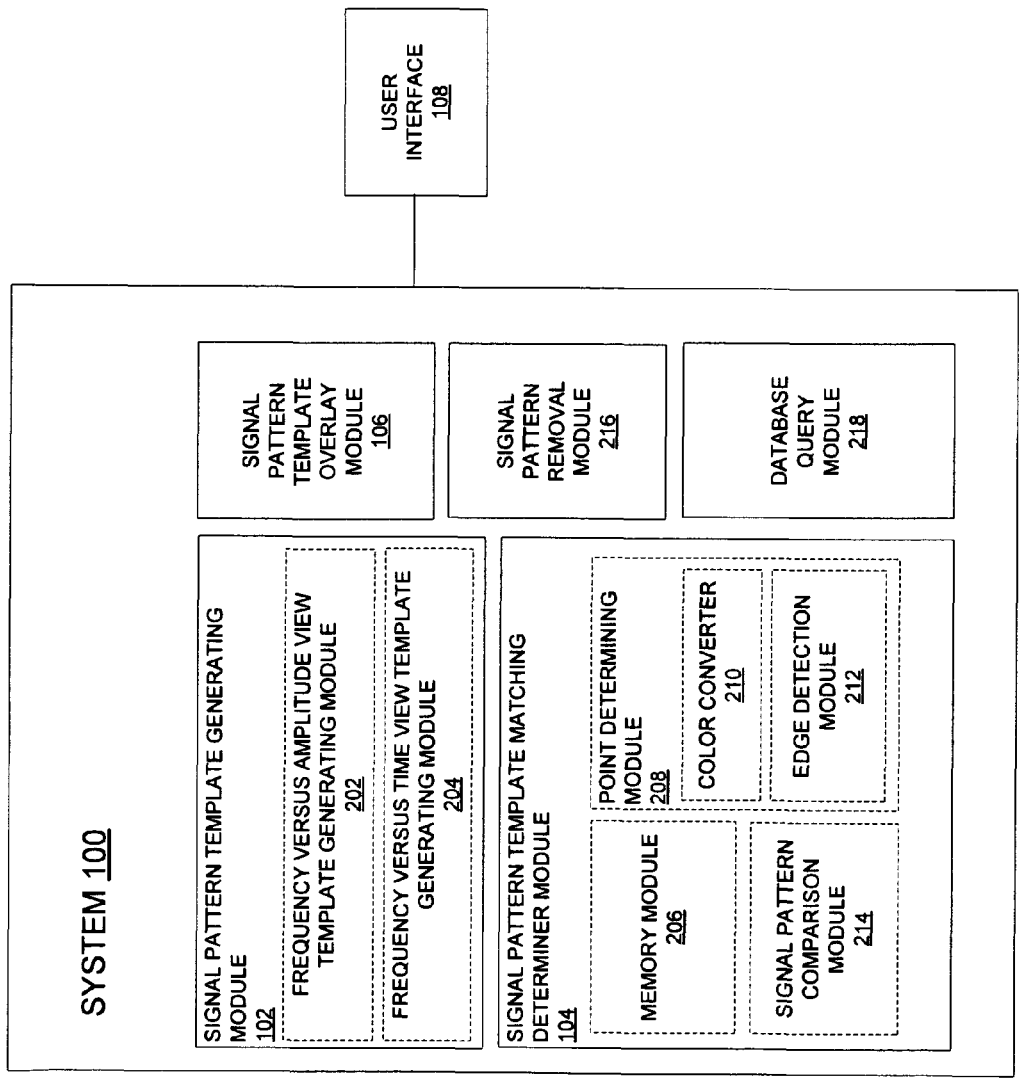
FIG. 2 illustrates a further exemplary environment in which one or more technologies may be implemented.

Referring to FIGS. 1 and 2, a system 100 related to signal pattern matching is illustrated. The system 100 may include a signal pattern template generating module 102 generating a plurality of signal pattern templates for a plurality of radio frequency communication signals, a signal pattern comparison module 104 comparing a detected signal pattern to at least one of the plurality of generated signal pattern templates, and a signal pattern template overlay module 106 overlaying the matching signal pattern over the detected signal pattern. System 100 may detect and analyze electronic signals from devices or transmissions that utilize radio frequency communication to transmit signals having a distinct pattern, shape, and/or signature. System 100 may be implemented with the SYSTEM AND APPARATUS FOR DETECTING AND ANALYZING A FREQUENCY SPECTRUM, as described in U.S. application Ser. No. 11/605,839, SPECTRUM ANALYZER USER INTERFACE, as described in U.S. application Ser. No. 11/973,683, and SPECTRUM ANALYZER INTERFACE, as described in U.S. application Ser. No. 12/220,902 which are herein incorporated by reference.

Figure 3:
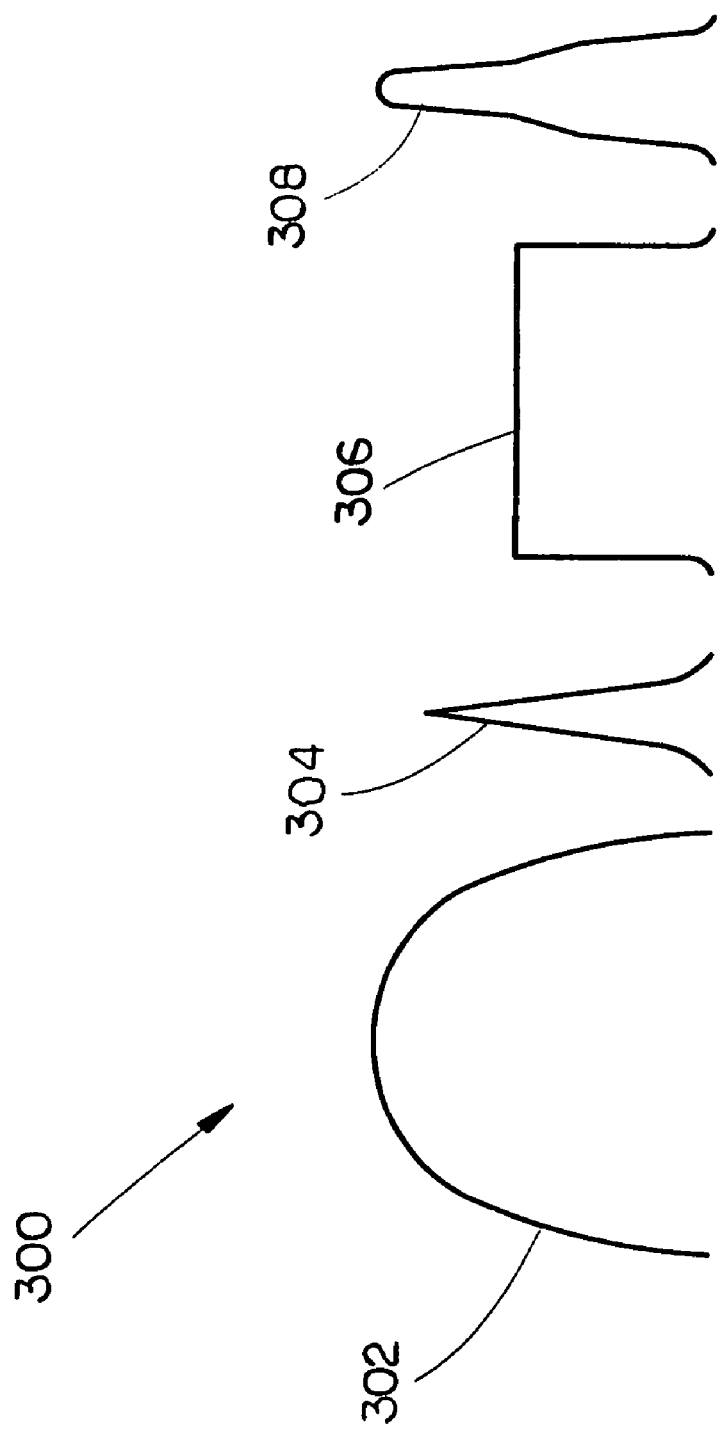
FIG. 3 illustrates a graphical representation of a spectrum analyzer in which at least a portion of the system illustrated in FIG. 1 and FIG. 2 has been implemented.

As stated, the signal pattern template generating module 102 may generate or more signal pattern templates (e.g., stencils, outlines, etc.) for one or more signal patterns. A signal pattern may be visual representations of a signal transmitted from an electronic device on a channel of a band of communication channels. For example, 802.11b transmits a 22 MHz wide signal that is strongest in the center and weaker on the edges, creating an arched shape when viewed on a spectrum analyzer. Bluetooth on the other hand transmits a 1 MHz wide signal and changes channel 1600 times per second. Devices may include a specific transmission signature detectable and identifiable by the system 100. Signal patterns and signal pattern templates may be viewable on a display such as a user interface 108. FIG. 3 illustrates a graphical representation of a spectrum analyzer display 300 in which at least a portion of the system illustrated in FIG. 1 and FIG. 2 has been implemented. Specifically, FIG. 3 illustrates a plurality of signal pattern templates 302-308 that may be generated by the signal pattern template generating module 102. The signal pattern template generating module 102 may further include a frequency versus amplitude view template generating module 202 (FIG. 2) generating at least one signal pattern template outlining a signal pattern template outlining a detectable signal viewable on a user interface in a frequency versus time view. A template may outline a signal pattern in frequency/amplitude view or in frequency/time view as desired. The frequency/time view template allows frequency hopping signal patterns to be identified quickly. The frequency/amplitude view template may allow non-frequency hopping patterns to be identified. A combination of templates may be utilized, which may be useful for certain signal patterns.

The signal pattern comparison module 104 may further include a memory module 206 for storing metadata for a detected signal pattern. The memory module 206 for storing metadata for a detected signal pattern may store at least one of an allowed central frequency, an expected frequency range, a geographic location (e.g., GPS coordinates, street address), a geographic region (e.g., North America), device identifying information, timestamp and/or a date stamp. For instance, in one embodiment, the metadata may include at least one of any/all of allowed central frequencies (e.g. 802.11b has 14 possible central frequencies based on the 802.11 channels), a typical or expected frequency range, typical or common locations (hotels, pubs, schools, etc), geographic region(s) (some devices are only sold in specific countries), typical times of day, device ubiquity (how common a device is), etc. Metadata may be incorporated into a template to improve signal pattern matching. For instance, metadata may be utilized by the signal pattern template matching determiner module 104 to adjust the probability that an input signal pattern matches a template. For instance, if two templates had a similar measured distance for a given signal pattern, but the time of day, and region matched one of the templates, the template having the time of day and region match may be allocated a higher probability of being the correct match.

Figure 6:
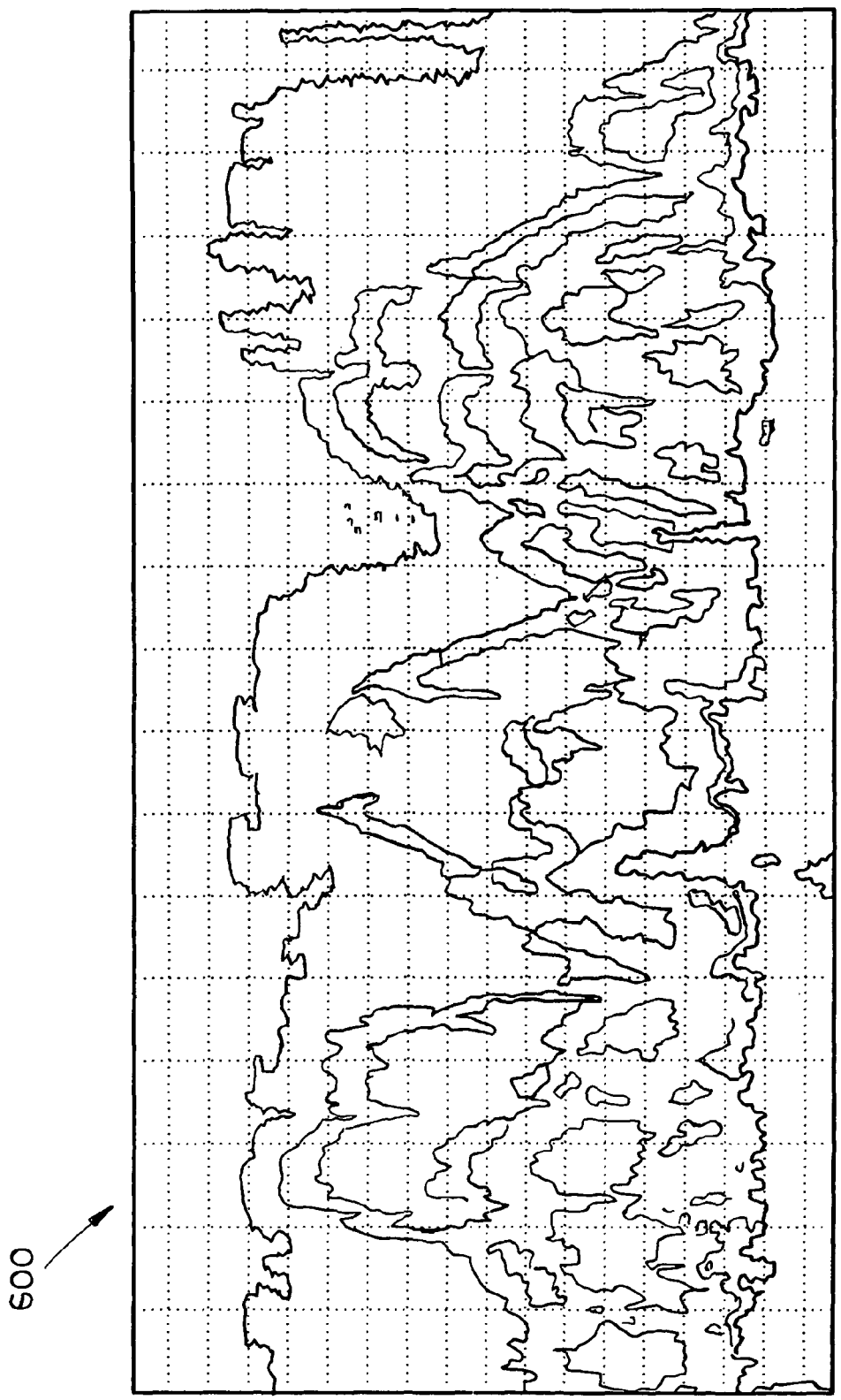
FIG. 6 illustrates a graphical representation of a spectrum analyzer in which at least a portion of the system illustrated in FIG. 1 and FIG. 2 has been implemented.
Figure 7:
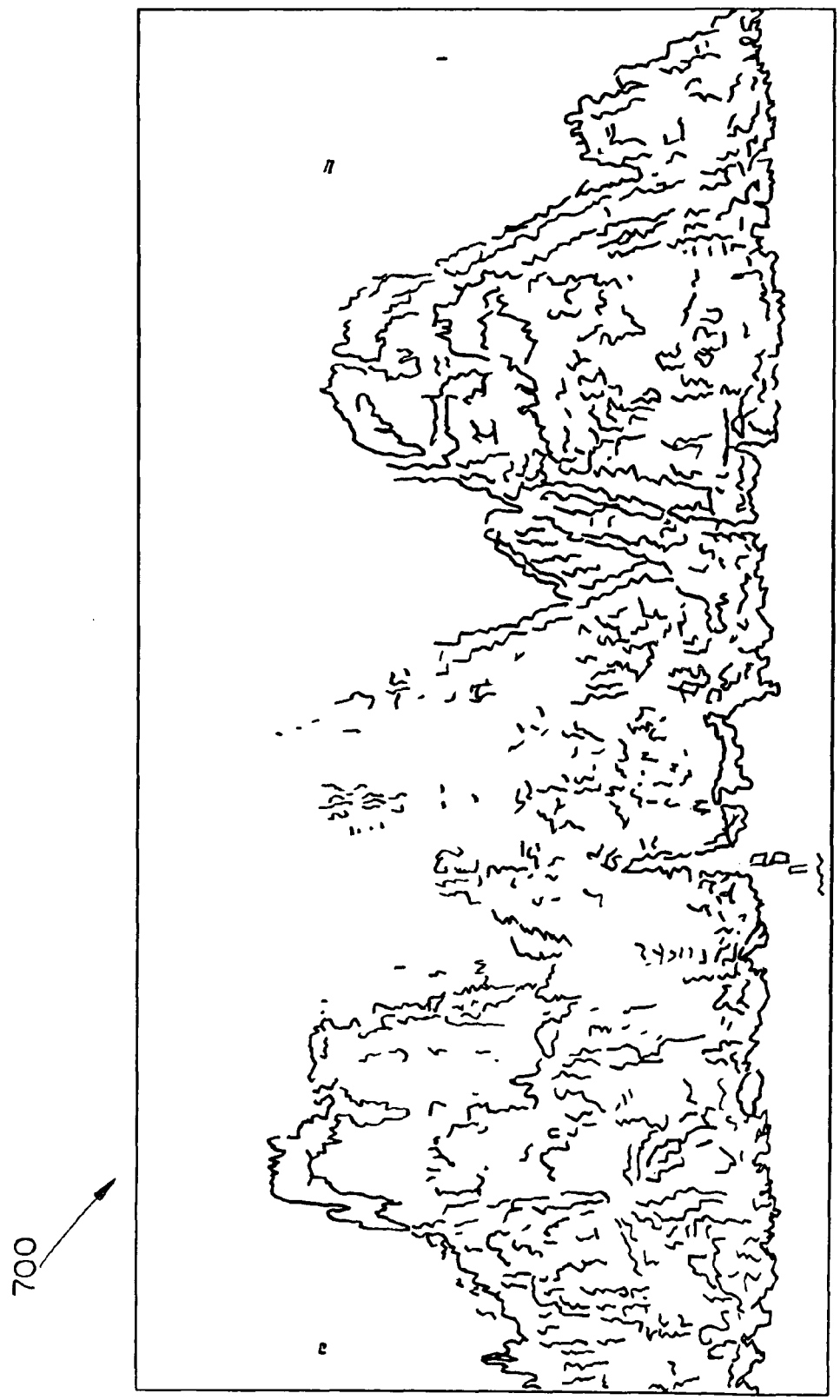
FIG. 7 illustrates a graphical representation of a spectrum analyzer in which at least a portion of the system illustrated in FIG. 1 and FIG. 2 has been implemented.

The signal pattern template matching determiner module 104 may further include a point calculating module 208 calculating a plurality of points forming the detected signal pattern. The point determining module 208 may further include a color converter 210 converting a color image of the detected signal pattern into a grayscale image. FIGS. 6 and 7 illustrate a graphical representation of a spectrum analyzer display in which at least a portion of the system 100 illustrated in FIG. 1 and FIG. 2 has been implemented. Specifically, FIGS. 6 and 7 illustrate spectrum analyzer images 600, 700 converted from a 256-color image 600 (e.g. 256 bit color image) to a grayscale image 700. The point calculating module 208 may further include an edge detection module 212 including one or more edge detection algorithms for identifying points in a digital image at which the image includes one or more discontinuities (e.g., changes in the image brightness, etc.). The edge detector may be a Canny edge detector, a Canny-Deriche edge detector, a differential edge detector, a blob detector (e.g., visual modules that are aimed at detecting points and/or regions in the image that are either brighter or darker than a surrounding region.) or any other edge detector suitable for detecting points of a detected signal pattern, and/or discontinuities in image brightness that may correspond to discontinuities in depth, discontinuities in surface orientation, changes in material properties and/or variations in scene illumination. The image may then be input into the edge detection module to detect the signal pattern lines. For instance, the edge detection module 212 may then receive an input grayscale image generated by the color converter and generate an output image displaying a plurality of tracked intensity discontinuity locations.

The signal pattern template matching determiner module 104 may further include a signal pattern comparison module 214 comparing a detected signal pattern to the plurality of generated signal pattern templates. The signal pattern template matching determiner module 104 may utilize automated signal pattern matching. Upon generating a template for a signal pattern, the signal pattern comparison module 214 of the signal pattern template matching determiner module 104 may compare the template with a received signal signature. Point determining module 208 may determine a plurality of points comprising the signal pattern (e.g., signature), as a signal pattern may overlap another signal pattern across a frequency spectrum. The distance between points on the template and the points on the received signal pattern may be measured. The probability of a signal pattern matching a template may then be calculated based on the measured distance (e.g., the smaller the distance the more likely the template matches the signal pattern). The signal pattern template matching determiner module 104 may determine an exact match, a partial match, a substantial match, etc for a detected/received signal pattern. For instance, it is contemplated that one or more templates may not match a detected/received signal exactly. Further, multiple templates may match partially. In such instances, all, substantially all, or as many of the factors (location, region, etc) as needed may be input into the signal pattern template matching determiner module 104 to determine a final score for each template. The signal pattern template with the greatest determined matching probability (e.g., highest final score) may be selected by the signal pattern template matching determiner module 104.

Figure 4:
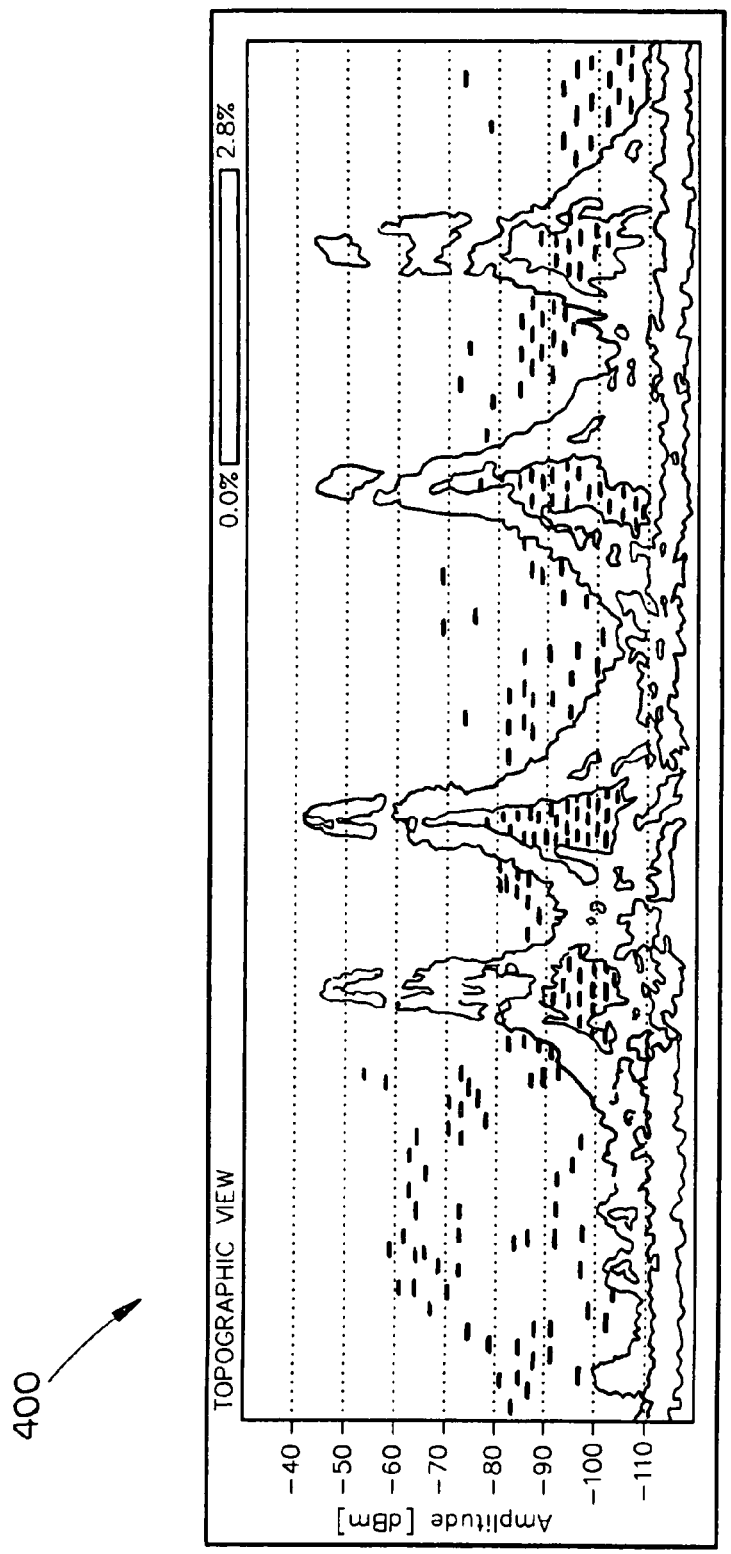
FIG. 4 illustrates a graphical representation of a spectrum analyzer in which at least a portion of the system illustrated in FIG. 1 and FIG. 2 has been implemented.
Figure 5:
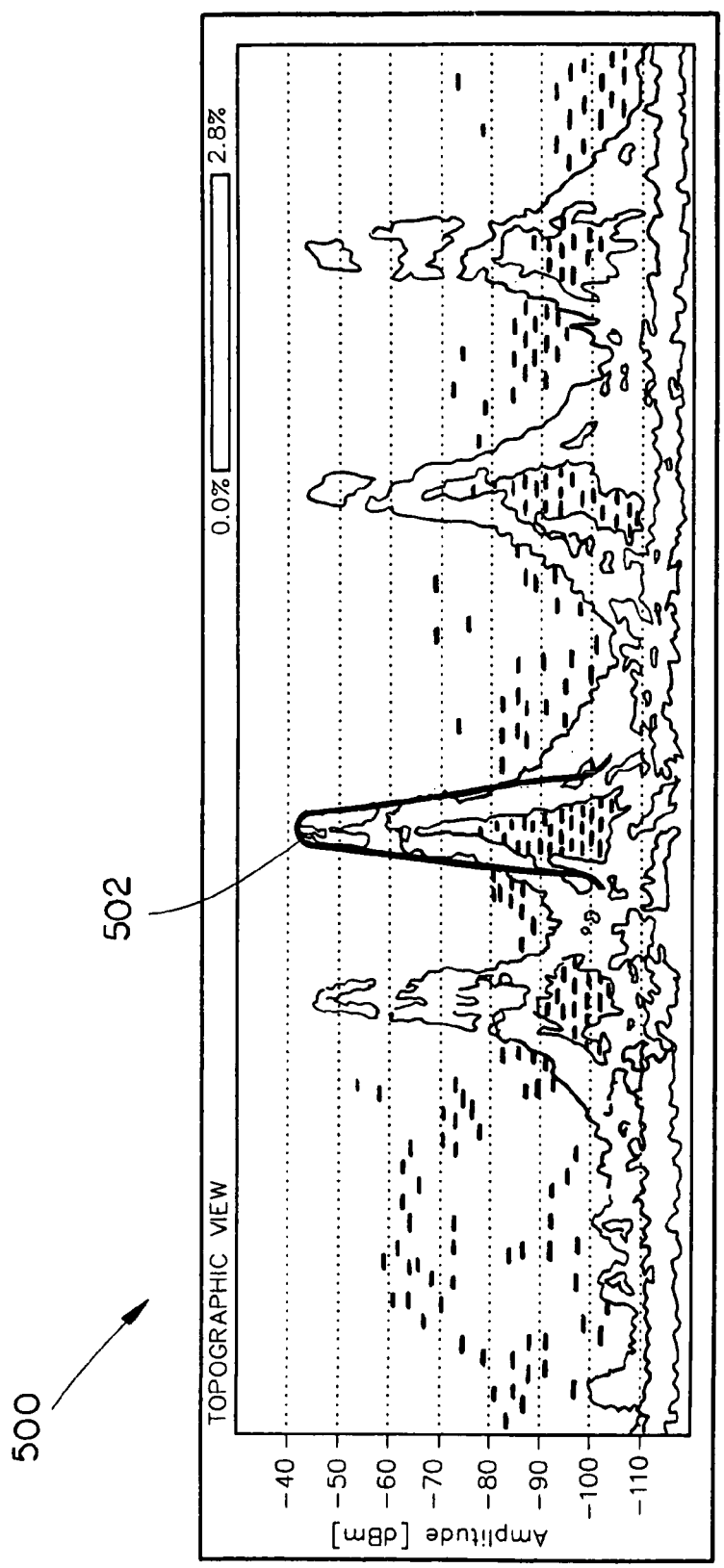
FIG. 5 illustrates a graphical representation of a spectrum analyzer in which at least a portion of the system illustrated in FIG. 1 and FIG. 2 has been implemented.

The signal pattern template overlay module 106 may then provide an overlay of the matching signal pattern template over the detected/received signal pattern. FIGS. For instance, upon determination by the edge detection module 212 of one or more lines related to the signal pattern, the center frequency of the template may be overlaid on the center frequency of the received signal pattern. FIGS. 4 and 5 illustrate graphical representations 400, 500 of a spectrum analyzer in which at least a portion of the system illustrated in FIG. 1 and FIG. 2 has been implemented. FIG. 4 illustrates a detected/received signal pattern, and FIG. 5 illustrates a detected/received signal pattern having a template overlaid over a region of the signal pattern.

System 100 may include a signal pattern removal module 214 to remove one or more detected signal patterns from the spectrum analyzer image of detected signals. Signal pattern removal module 216 may utilize, for example, extended use of artificial intelligence algorithms. In one embodiment one or more signal patterns may be identified and a line detection algorithm may be utilized to remove the signal pattern from the spectrum analyzer image. Removing a signal pattern (e.g., a dominant or strong signal pattern) from the image may allow less dominant or obvious patterns to become more visible. A less obvious pattern may then be matched to a template and identified. This process can be repeated as desired, or until no matter patterns are identifiable.

The line distance measurements used to determine the probability of a template match may also be utilized to continuously refine the templates, by adjusting the template pattern to more closely match the identified signal patterns.

System 100 may further include a database query module 218. The database query module 218 may query a central database, server, or other sources or collections of signal patterns to either retrieve new and/or updated templates, or upload a unidentifiable signal pattern to the database (e.g., if the system 100 cannot determine matching template for a signal pattern). The database may compare the signal pattern with other signal patterns to determine if the signal pattern has ever been seen before. Known signal pattern information may be downloaded to the system 100 for use in matching a signal pattern to a template, generating a new template, etc. Also, metadata about the location and environment of the signal pattern can be added to the central database and/or system memory module 206 to create a profile for the signal pattern. The profile may include metadata from one or more detections of the signal pattern, and as information is collected, the profile may be refined.

FIG. 8 illustrates an operational flow 800 representing example operations related to FIGS. 1-7. In FIG. 8 and in following figures that include various examples of operational flows, discussion and explanation may be provided with respect to the above-described examples of FIGS. 1-7 and/or with respect to other examples and contexts. However, it should be understood that the operational flows may be executed in a number of other environments and contexts, and/or in modified versions of FIGS. 1-7. Also, although the various operational flows are presented in the sequence(s) illustrated, it should be understood that the various operations may be performed in other orders than those which are illustrated, or may be performed concurrently.

After a start operation, the operational flow 800 moves to an operation 802. Operation 802 depicts generating a plurality of signal pattern templates for a plurality of radio frequency communication signals. FIGS. 1 and 2 and corresponding description illustrate an exemplary signal pattern template generating module 102. A signal pattern template may be an overlay, stencil, etc. of a signal pattern that may be overlaid onto the spectrum analyzer display. A signal pattern may be visual representations of a signal transmitted from an electronic device on a channel of a band of communication channels. For example, 802.11b transmits a 22 MHz wide signal that is strongest in the center and weaker on the edges, creating an arched shape when viewed on a spectrum analyzer. Bluetooth on the other hand transmits a 1 MHz wide signal and changes channel 1600 times per second. Devices may include a specific transmission signature detectable and identifiable by the system 100. Operation 804 depicts determining a matching signal pattern template for a detected signal pattern. FIGS. 1 and 2 and corresponding description illustrate an exemplary matching signal pattern template determiner module 104. Operation 806 depicts overlaying the matching signal pattern over the detected signal pattern. FIGS. 1 and 2 and corresponding description illustrate an exemplary signal pattern template overlay module 106.

FIG. 9 illustrates alternative embodiments of the example operational flow 800 of FIG. 8. FIG. 9 illustrates example embodiments where the operation 804 may include at least one additional operation. Additional operations may include an operation 902, and/or an operation 904. Operation 902 depicts the generating a plurality of signal pattern templates for a plurality of radio frequency communication signals may include generating at least one signal pattern template outlining a detectable signal viewable on a user interface in a frequency versus amplitude view. FIG. 2 and corresponding description illustrate an exemplary frequency versus amplitude view template generating module 202. Operation 904 depicts the generating a plurality of signal pattern templates for a plurality of radio frequency communication signals may include generating at least one signal pattern template outlining a detectable signal viewable on a user interface in a frequency versus time view. FIG. 2 and corresponding description illustrate an exemplary frequency versus time view template generating module 204.

FIG. 10 illustrates alternative embodiments of the example operational flow 800 of FIG. 8. FIG. 10 illustrates example embodiments where the operation 802 may include at least one additional operation. Additional operations may include an operation 1002, and/or an operation 1004. Operation 1002 depicts storing metadata for a detected signal pattern. FIG. 2 and corresponding description illustrate an exemplary memory module 206. Operation 1004 depicts storing metadata including at least one of an allowed central frequency, an expected frequency range, a geographic location (e.g., GPS coordinates, street address), a geographic region (e.g., North America), device identifying information, a timestamp and/or a date stamp.

FIG. 11 illustrates alternative embodiments of the example operational flow 800 of FIG. 8. FIG. 11 illustrates example embodiments where the operation 804 may include at least one additional operation. Additional operations may include an operation 1102, 1104, 1106, 1108 and/or an operation 1110. Operation 1102 depicts the determining a matching signal pattern template for the detected signal pattern includes determining a plurality of points forming the detected signal pattern. FIG. 2 and corresponding description illustrate an exemplary point determining module 208. Operation 1104 depicts converting a color image of the detected signal pattern into a grayscale image. FIG. 2 and corresponding description illustrate an exemplary color converter 210. Operation 1106 depicts calculating a plurality of points forming the detected signal pattern includes utilizing an edge detection algorithm. FIG. 2 and corresponding description illustrate an exemplary edge detection module 212. Operation 1108 depicts detecting an input grayscale image and generating an output image displaying a plurality of tracked intensity discontinuity locations. Operation 1110 depicts comparing a detected signal pattern to the plurality of generated signal pattern templates. FIG. 2 and corresponding description illustrate an signal pattern comparison module 214.

Method 800 may include removing a signal pattern. FIG. 2 and corresponding description illustrate an exemplary signal pattern removal module 216. Removing a signal pattern may include removing one or more detected signal patterns from the spectrum analyzer image of detected signals. Signal pattern removal module 216 may utilize, for example, extended use of artificial intelligence algorithms. In one embodiment one or more signal patterns may be identified and a line detection algorithm may be utilized to remove the signal pattern from the spectrum analyzer image. Removing a signal pattern (e.g., a dominant or strong signal pattern) from the image may allow less dominant or obvious patterns to become more visible. A less obvious pattern may then be matched to a template and identified. This process can be repeated as desired, or until no matter patterns are identifiable.

Method 800 may further include utilizing one or more line distance measurements to determine the probability of a template match may also be utilized to continuously refine the templates, by adjusting the template pattern to more closely match the identified signal patterns.

Method 800 may also include querying database for signal pattern information. FIG. 2 illustrates a database query module 218. FIG. 2 and corresponding description illustrate an exemplary database query module 218. The database query module 218 may query a central database, server, or other sources or collections of signal patterns to either retrieve new and/or updated templates, or upload a unidentifiable signal pattern to the database (e.g., if the system 100 cannot determine matching template for a signal pattern). The database may compare the signal pattern with other signal patterns to determine if the signal pattern has ever been seen before. Known signal pattern information may be downloaded to the system 100 for use in matching a signal pattern to a template, generating a new template, etc. Also, metadata about the location and environment of the signal pattern can be added to the central database and/or system memory module 206 (FIG. 2) to create a profile for the signal pattern. The profile may include metadata from one or more detections of the signal pattern, and as information is collected, the profile may be refined.

Various embodiments of the present invention include one or more techniques described below relating to device recognition based on signal patterns. Each of these techniques may be implemented using standard user interface techniques, such as standard graphical software programming or the like. Of course any programming language or environment could be used to implement the techniques described herein. It is to be further noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. It is to be understood that the present invention may be conveniently implemented in forms of a software package. Such a software package may be a computer program product which employs a computer-readable storage medium including stored computer code which is utilized to program a computer to perform the disclosed function and process of the present invention. The computer-readable medium may include, but is not limited to, any type of conventional floppy disk, optical disk, compact disc read only memory (CD-ROM), magneto-optical disk, read only memory (ROM), random access memory (RAM), erasable programmable read only memory (EPROM), electrically erasable read only memory (EEPROM), magnetic or optical card, or any other suitable media for storing electronic instructions. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed:

1. A computer implemented method comprising:
   generating a plurality of signal pattern templates for a plurality of radio frequency communication signals;
   determining, via a processor, a matching signal pattern template for a detected signal pattern, further including comparing a detected signal pattern to the plurality of generated signal pattern templates, wherein the comparing a detected signal pattern to the plurality of generated signal pattern templates via automated signal pattern matching, further includes:
   comparing the template with a received signal signature by may determining a plurality of points comprising the signal pattern, measuring the distance between points on the template and the points on the received signal pattern;

calculating the probability of a signal pattern matching a template based on the measured distance;

determining a final probability score for each of the plurality of generated signal pattern templates; and selecting a signal pattern template with the greatest final probability score; and overlaying the matching signal pattern over the detected signal pattern.

2. The method of claim 1, wherein the generating a plurality of signal pattern templates for a plurality of radio frequency communication signals includes:

generating at least one signal pattern template outlining a detectable signal viewable on a user interface in a frequency versus amplitude view.

3. The method of claim 1, wherein the generating a plurality of signal pattern templates for a plurality of radio frequency communication signals includes:

generating at least one signal pattern template outlining a detectable signal viewable on a user interface in a frequency versus time view.

4. The method of claim 1, wherein the generating a plurality of signal pattern templates for a plurality of radio frequency communication signals includes:

storing metadata for a detected signal pattern.

5. The method of claim 1, wherein the storing metadata for a detected signal pattern includes:

storing at least one of an allowed central frequency, an expected frequency range, a geographic location, a geographic region, device identifying information, or a timestamp.

6. The method of claim 1, wherein the determining a matching signal pattern template for the detected signal pattern includes:

calculating a plurality of points forming the detected signal pattern.

7. The method of claim 6, wherein the calculating a plurality of points forming the detected signal pattern includes:

utilizing an edge detection algorithm; or utilizing a blob detection algorithm.

8. The method of claim 6, wherein the calculating a plurality of points forming the detected signal pattern includes:

converting a color image of the detected signal pattern into a grayscale image.

9. The method of claim 6, wherein the calculating a plurality of points forming the detected signal pattern includes:

detecting an input grayscale image and generating an output image displaying a plurality of tracked intensity discontinuity locations.

10. A system comprising:

a signal pattern template generating module generating a plurality of signal pattern templates for a plurality of radio frequency communication signals;

a signal pattern template matching determiner module determining a matching signal pattern template for the detected signal pattern further including:

a signal pattern comparison module comparing a detected signal pattern to the plurality of generated signal pattern templates;

a point determining module determine a plurality of points comprising the signal pattern; and a signal pattern template matching determiner module, wherein the signal pattern template matching determiner module utilizes automated signal pattern matching for generating a template for a signal pattern, and comparing the template with a received signal signature and is further configured to measure the distance between points on the template and the points on the received signal pattern and calculate the probability of a signal pattern matching a template based on the measured distance, the signal pattern template matching determiner module determines at least a partial match for a received signal pattern, and determines a final score for each template, and the signal pattern template matching determiner module selects the signal pattern template with the greatest determined matching probability; and a signal pattern template overlay module overlaying the matching signal pattern over the detected signal pattern.

11. The system of claim 10, wherein the signal pattern template generating module generating a plurality of signal pattern templates for a plurality of radio frequency communication signals includes:

a frequency versus amplitude view template generating module generating at least one signal pattern template outlining a detectable signal viewable on a user interface in a frequency versus amplitude view.

12. The system of claim 10, wherein the signal pattern template generating module generating a plurality of signal pattern templates for a plurality of radio frequency communication signals includes:

a frequency versus time view template generating module generating at least one signal pattern template outlining a detectable signal viewable on a user interface in a frequency versus time view.

13. The system of claim 10, wherein the signal pattern template generating module generating a plurality of signal pattern templates for a plurality of radio frequency communication signals includes:

a memory module for storing metadata for a detected signal pattern.

14. The system of claim 10, wherein the storage for storing metadata for a detected signal pattern includes:

a memory module for storing at least one of an allowed central frequency, an expected frequency range, a geographic location, a geographic region, device identifying information, or a timestamp.

15. The system of claim 10, wherein the matching signal pattern template determiner module determining a matching signal pattern template for the detected signal pattern includes:

a point calculating module calculating a plurality of points forming the detected signal pattern.

16. The system of claim 15, wherein the point calculating module calculating a plurality of points forming the detected signal pattern includes:

a color image converter converting a color image of the detected signal pattern into a grayscale image.

17. The system of claim 15, wherein the point calculating module calculating a plurality of points forming the detected signal pattern includes:

an edge detector; or a blob detector.

18. The system of claim 15, wherein the point calculating module calculating a plurality of points forming the detected signal pattern includes:

a detector detecting an input grayscale image and generating an output image displaying a plurality of tracked intensity discontinuity locations.

* * * * *